US009282677B2

(12) United States Patent
Miettinen et al.

(10) Patent No.: US 9,282,677 B2
(45) Date of Patent: Mar. 8, 2016

(54) POWER ELECTRONICS DEVICE

(71) Applicant: VACON OYJ, Vaasa (FI)

(72) Inventors: Osmo Miettinen, Vaasa (FI); Jukka Jaskari, Vaasa (FI); Stefan Strandberg, Vörå (FI); Trygve Björkgren, Kvevlax (FI); Hannu Sarén, Vantaa (FR); Magnus Hortans, Sundom (FI)

(73) Assignee: VACON OYJ, Vaasa (FI)

( * ) Notice: Subject to any disclaimer, the term of this patent is extended or adjusted under 35 U.S.C. 154(b) by 170 days.

(21) Appl. No.: 14/072,124

(22) Filed: Nov. 5, 2013

(65) Prior Publication Data
US 2014/0140005 A1 May 22, 2014

(30) Foreign Application Priority Data
Nov. 20, 2012 (FI) .................................. 20126218 U

(51) Int. Cl.
H05K 7/20 (2006.01)
H02M 7/00 (2006.01)

(52) U.S. Cl.
CPC ........... *H05K 7/20272* (2013.01); *H02M 7/003* (2013.01)

(58) Field of Classification Search
CPC ........................... H02M 7/003; H05K 7/20272
USPC ................................ 361/688–723; 363/1–178
See application file for complete search history.

(56) References Cited

U.S. PATENT DOCUMENTS

| 6,219,265 B1 * | 4/2001 | Bernet ................... H02M 7/487 363/137 |
| 6,985,371 B2 | 1/2006 | Talja et al. |
| 2003/0151893 A1 * | 8/2003 | Meyer .................... H02M 1/44 361/688 |
| 2008/0078529 A1 * | 4/2008 | Miettinen ............. H01L 23/427 165/104.21 |
| 2010/0302729 A1 * | 12/2010 | Tegart .................... H05K 7/209 361/692 |
| 2011/0146962 A1 | 6/2011 | Kamula |
| 2012/0188712 A1 * | 7/2012 | Ishibashi ............... H02M 7/003 361/688 |
| 2013/0077244 A1 * | 3/2013 | Bajan ................. H05K 7/20927 361/699 |

FOREIGN PATENT DOCUMENTS

| DE | 102011100526 A1 | 11/2012 | |
| EP | 2521432 | * 11/2012 | ......... H05K 7/20927 |
| EP | 2521432 A2 | * 11/2012 | ......... H05K 7/20927 |
| JP | 2006-174572 A | 6/2006 | |
| WO | WO 2005/104643 A1 | 3/2005 | |

* cited by examiner

*Primary Examiner* — Anthony Haughton
*Assistant Examiner* — Yahya Ahmad
(74) *Attorney, Agent, or Firm* — Birch, Stewart, Kolasch & Birch, LLP

(57) ABSTRACT

Power electronics device, such as a frequency converter, which includes liquid-cooled power units (REC$_5$, REC$_6$, AFE$_5$, AFE$_6$, INU$_4$, INU$_5$, DC/DC, DC/AC) and also a substrate arrangement. The power units include at least one power semiconductor component, e.g. an IGBT or a diode, connected to at least one power circuit connecting them. The power units are mechanically separate and they are disposed on at least one substrate provided with liquid cooling ducts. The substrate is common to more than one power unit, wherein the substrate includes liquid cooling interfaces and power circuit interfaces for each power unit that can be connected to it. In addition, the substrate includes one liquid cooling interface and one power circuit interface (DC+, DC−) to outside the substrate.

20 Claims, 3 Drawing Sheets

--Prior Art--

Figure 1:
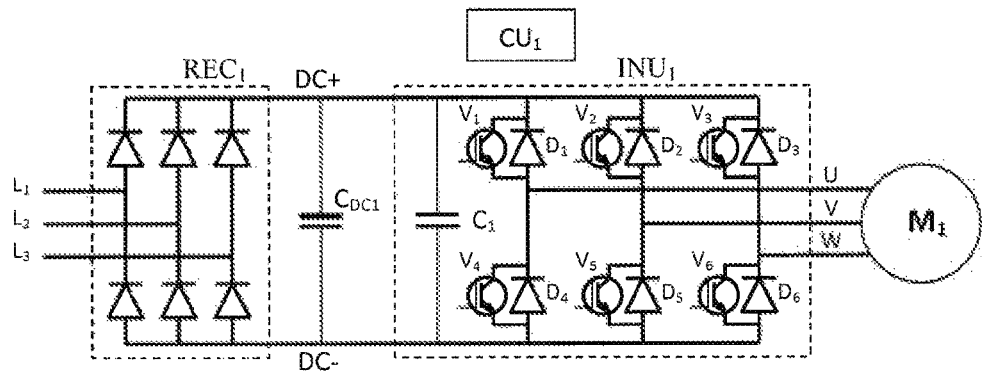

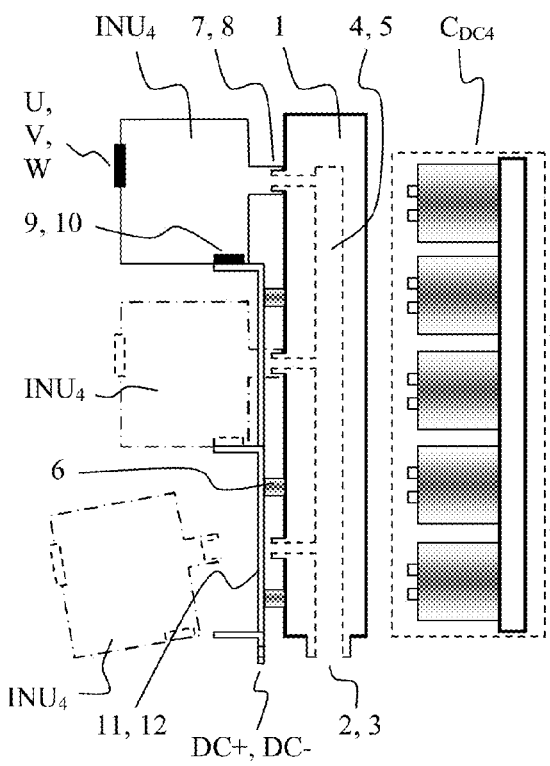
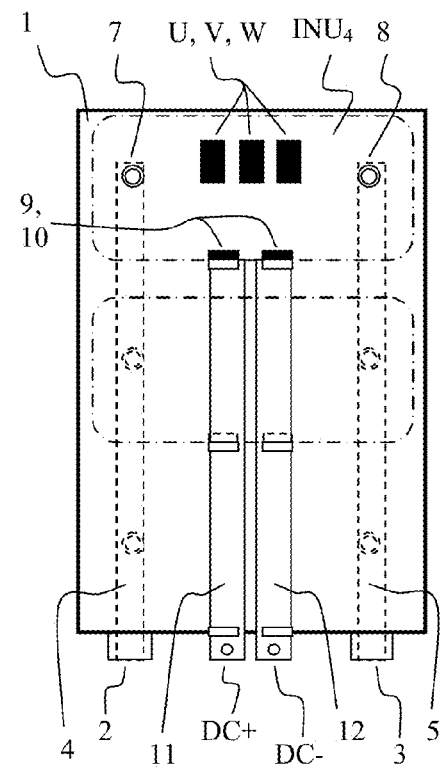
Fig. 4A                Fig. 4B
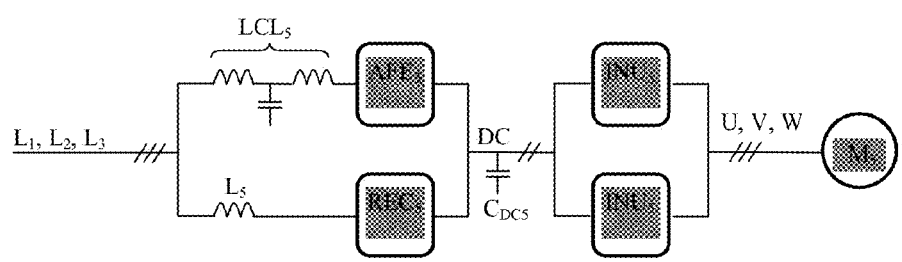
Fig. 5

POWER ELECTRONICS DEVICE

FIELD OF TECHNOLOGY

The object of this invention is a structural arrangement of a power electronics device, more particularly of a frequency converter. More particularly the object of the invention is a structural arrangement of a liquid-cooled frequency converter, when a number of inverter units are connected to the same direct-current intermediate circuit.

PRIOR ART AND DESCRIPTION OF PROBLEM

The general development trend of power electronics devices, such as frequency converters, is an increase in power density. It is known in the art that handling of high power in a small-sized device requires effective cooling of the components handling the power, which best succeeds with liquid cooling, i.e. by transferring the dissipation power produced in the components via liquid circulating in the device to outside the device.

For reasons of cost, liquid cooling is most often used only in high-powered devices, e.g. in frequency converters of over 100 kW. Owing to the limited performance of an individual power semiconductor component, at high powers they must be connected in parallel, either in such a way that there are a number of components in parallel in the same device or by connecting whole devices in parallel to supply the same load. Parallel connection of components in the same device is problematic particularly because each differently-powered device must have its own mechanical structural unit constructed. For this reason, parallel connections of whole devices are generally used, which is more advantageous from the viewpoint of, inter alia, manufacturing and servicing.

From the viewpoint of cooling, parallel connection of multiple liquid-cooled devices can be a problem because also many devices required for circulating the cooling liquid are required, or alternatively a common cooling apparatus must be used that must be dimensioned on a case-by-case basis according to the cooling requirement of the whole apparatus. Arranging sufficiently similar cooling conditions for all the devices connected in parallel can require adjustment of the flows with extra valves.

With serial connections it must be ensured that the load current is divided as evenly as possible between the components handling the sum power. In the case of power components connected in parallel, as is known, the requirement can result in the selection of components and/or the use of additional chokes limiting current imbalances e.g. according to patent publication U.S. Pat. No. 6,985,371, both of which methods are problematic from the viewpoint of manufacture and servicing as well as of costs. In the case of devices connected in parallel the requirement generally results in an impedance, such as e.g. a phase-specific choke, having to be connected in series with each device, i.e. between the device and the load supplied by the device together its other devices, said impedance limiting the drifting into imbalance of the currents.

SUMMARY OF THE INVENTION

The aim of this invention is to achieve a new type of arrangement for the construction of a compact liquid-cooled power electronics device, more particularly a frequency converter, when a number of power units belong to the same apparatus. The aforementioned drawbacks can be avoided with the arrangement, and it is suited for use both when the power units are connected in parallel and also when they are used for different functions. The aim of the invention is achieved with an arrangement, which is characterized by what is stated in the characterization part of the independent claim 1. Other preferred embodiments of the invention are the objects of the dependent claims.

The main principle characteristic to the invention is that in the arrangement the mechanically separate power units that belong to the apparatus are disposed on a common, preferably metallic, substrate, which functions as their mechanical support structure and via which both their cooling and their interface to a common power circuit, such as to a DC voltage intermediate circuit of a PWM frequency converter, is handled.

In the arrangement according to the invention the cooling liquid interfaces are designed to be compatible in such a way that a waterproof interface forms between a power unit and the substrate at the same time as the unit is fixed to the substrate and to the power circuit, without separate fixing parts being connected to the liquid interface.

What is also characteristic of the invention is that all the power units disposed on the same substrate and possessing the same operation are very symmetrical, in terms of both their cooling and their electrical connections, which in this context means that the liquid flows cooling them are essentially equal without adjustments made e.g. by the aid of prior-art valves, which is achieved by arranging the liquid ducts of the units to be of fully the same shape (e.g. with parts cast with the same mold), and the pressure differences between the incoming and outgoing liquid connection points of the units are sufficiently equal (e.g. a difference of less than 5%).

the impedances to common power interface points (e.g. an interface to a common power circuit) of the electrical power connections inside them are essentially equal, which is achieved with switching parts that are completely similar or are mirror images with respect to each other (e.g. with busbars manufactured by an automatic machine tool), and the timing of the control pulses of the controllable power semiconductor components in parallel-connected power units is arranged to be as simultaneous as component tolerances allow (e.g. a time difference of less than 10 ns).

What is also characteristic of the invention is that the power units comprising controllable power semiconductor components comprise low-capacitance (e.g. less than 1 µF/A) capacitors connected electrically to a common power circuit but fitted mechanically very near the controllable power semiconductor components. These local capacitors limit voltage peaks related to switching phenomena and form a short current path to the higher-frequency (e.g. over 3 kHz) current components of the power circuit that are formed by the power unit, in which case the current stress of an energy storage disposed outside the common substrate decreases in this respect. The arrangement enables variation of the capacitance value of an external energy storage or of the component type flexibly according to the application or even operation completely without an external energy storage.

What is also characteristic of the invention is that all the power units comprising controllable power semiconductor components belonging to the same substrate are connected via a fast communications bus, e.g. a fiber-optic bus, to a common control unit, which receives and processes the measuring data notified by the power units, from where the power units can be programmably configured for different preselected tasks. The control unit can also control the timing of the control signals formed by the power units or the control unit can form the control signals of the controllable components, which signals are transmitted to the power units via a fast communications bus.

In the arrangement according to one embodiment of the invention some or all of the power units belonging to the same substrate are connected in parallel to supply the same load. The parallel-connected power units are in this case configured to be similar and they receive the same type of control signals from the control unit. Owing to the symmetry, the output connections of the power units can be connected directly together without serial impedances according to prior art limiting the current imbalances.

In the arrangement according to one embodiment of the invention some of the power units belonging to the same substrate are connected to supply a load and some to function in another task, e.g. as a connection unit between the supply network and the common power circuit. In both tasks there can be one or more power units in parallel. According to the invention the power units are configured to be different according to their tasks and they receive control signals according to their tasks correspondingly from a common control unit.

The arrangement according to the invention is very modular, because there are few power units that are different and they can easily be connected in parallel for extending the power range within the same substrate as well as also between different substrates. Also, the energy storage being separate supports modularity.

The arrangement according to the invention is also redundant in certain types of failure situations, such as e.g. when a detectable measuring circuit defect occurs in some power unit. The failed unit in question can in this case be controlled out of use, in which case the healthy units connected in parallel with it can continue their operation.

In parallel connections of multiple power units it is also possible to save energy by stopping some of the units when the total power requirement does not necessarily require the operation of all the units.

SHORT DESCRIPTION OF THE DRAWINGS

Figure 2:
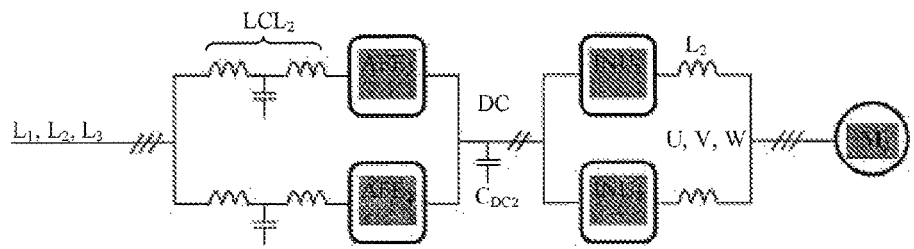
Figure 3:
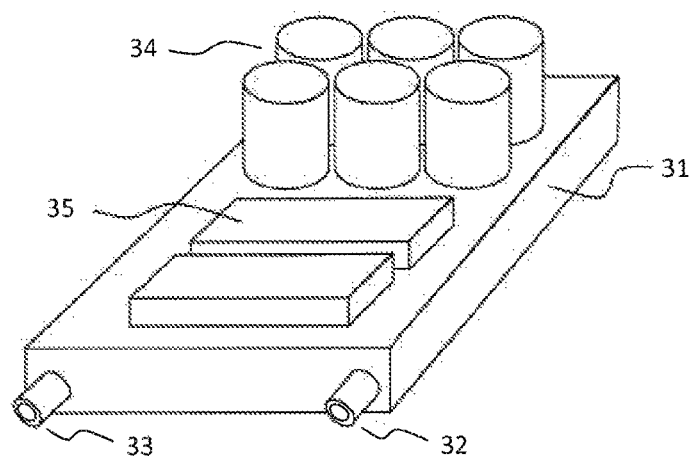
Figure 6:
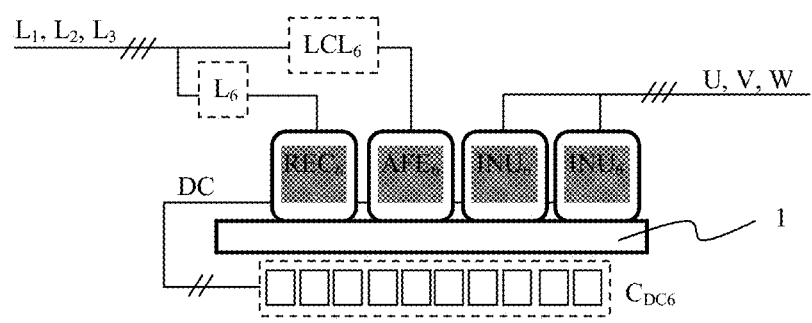
Figure 7:
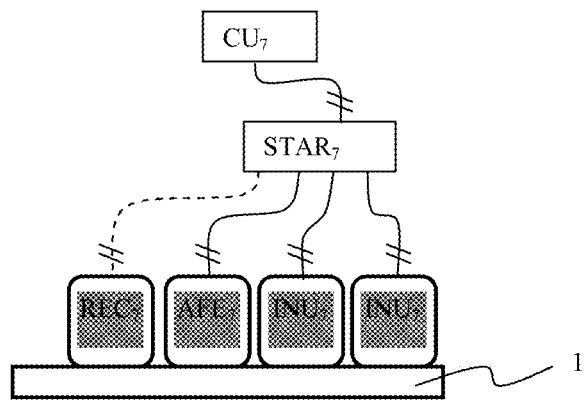

In the following, the invention will be described in more detail by the aid of some examples of its embodiments with reference to the attached drawings, wherein FIG. 1 presents the main circuit of a frequency converter drive, FIG. 2 presents the main circuit of a frequency converter drive, FIG. 3 presents the structure of a liquid-cooled frequency converter, FIGS. 4A and 4B present the structure of a frequency converter according to the invention, FIG. 5 presents the main circuit of a frequency converter drive according to the invention, FIG. 6 presents the structure of a frequency converter drive according to the invention, and FIG. 7 presents a control arrangement of a frequency converter according to the invention.

DETAILED DESCRIPTION OF THE INVENTION

FIG. 1 presents an embodiment of the main circuit of a normal so-called bi-level three-phase PWM frequency converter, in which circuit a three-phase network bridge $REC_1$ comprised of diodes rectifies the three-phase alternating voltage $L_1, L_2, L_3$ of the supply network into the DC voltage of the intermediate circuit, which DC voltage has the poles DC+, DC− and which is filtered with a filtering capacitor $C_{DC1}$ functioning as an energy storage. An inverter bridge $INU_1$ composed of three phase switches implemented with power semiconductor components $V_1$-$V_6$, $D_1$-$D_6$ forms from the DC voltage of the intermediate circuit three-phase output voltage U, V, W for controlling the motor $M_1$. A phase switch refers to components connecting to the same output phase, which components can connect the output phase to either pole of the intermediate circuit whatsoever, e.g. with respect to the U-phase the controllable power semiconductor components $V_1$, $V_4$, and the diodes $D_1$, $D_4$ in parallel with them. In modern frequency converters the power semiconductor components $V_1 \ldots V_6$ controlling the phase switches are most generally IGBT transistors according to the embodiment of the figure, in parallel with which so-called zero diodes $D_1 \ldots D_6$ are connected. For attenuating the change phenomena produced by operation of the inverter, the inverter normally also comprises a capacitor $C_1$ disposed physically near the power components, which capacitor is normally significantly smaller in terms of its capacitance value than the energy storage $C_{DC1}$. The control unit $CU_1$ controls the operation of the device. An inductive component is normally connected to either side of the network bridge for filtering the harmonics of the network current taken by the frequency converter, but it has not been drawn in the figure as it is of no significance from the viewpoint of the present invention.

FIG. 2 presents a single-line drawing of one known method for implementing a high-powered frequency converter, in which the power level requires a parallel connection of multiple devices. In the figure the capacitor $C_{DC2}$ functioning as an energy storage of the intermediate circuit is common to all the inverters $INU_2$, the output phases of which inverters are connected together via inductive components $L_2$, as has become known e.g. from patent publication U.S. Pat. No. 6,985,371, for supplying a common load motor $M_2$. When there is a need to supply the braking power of a motor back to the network, it is known to use inverter units, which are physically similar to the units $INU_2$ supplying the motor, also on the supply network side. According to the figure, the marking $AFE_2$ is used as their identification in this context, and they are connected normally to the network via a three-step filter unit $LCL_2$.

FIG. 3 presents a structural arrangement of a liquid-cooled frequency converter or inverter unit known from, inter alia, publication U.S. Ser. No. 12/949,386. In the figure, the external liquid circulation is connected to the cooler 31 via the input connector 32 and the output connector 33. The power components that require cooling, such as capacitors 34 and power semiconductor modules 35, are fixed, to achieve the most effective possible heat transfer, directly against the cooler, e.g. by screwing or by compressing by the aid of suitable additional parts. According to this arrangement, each frequency converter or inverter unit has its own cooler.

FIGS. 4A and 4B present an embodiment of a structural arrangement of a liquid-cooled power electronics device, such as of a frequency converter, according to this invention. In the figures the structure is described from two directions, in FIG. 4A from the side and in FIG. 4B from the front. The parts that are not essential from the viewpoint of describing the invention, such as electrical insulations, sealing accessories and fastening accessories, details of electrical and mechanical joints, et cetera, are not presented in the figures.

In the arrangement, multiple power units, in the embodiment of the figure the inverter units $INU_4$, have a shared substrate 1, via which they connect to a shared external cooling liquid circulation and to a power connection. The cooling liquid circulates from external connectors 2, 3 via main ducts 4, 5 inside the substrate that are made e.g. by boring, via the connections 7, 8 of the specific power units to inside the power units cooling them. In the arrangement according to the invention the cooling liquid interfaces 7, 8 are designed to be compatible in such a way that a waterproof interface forms between a power unit and the substrate at the same time as the unit is fixed to the substrate and to the power circuit, without separate fixing parts being connected to the liquid interface. According to the invention the flow resistance of the main ducts is so small compared to the flow resistances of the power units that the pressure differences in the liquid connections of the respective power units differ from each other by at most 5%, which guarantees sufficiently similar cooling conditions inside the power units regardless of their position. This type of flow resistance arrangement can be implemented, as is known in the art, e.g. by dimensioning the cross-sectional area of the main duct and the flow resistance depending on it to be sufficiently large with respect to the internal flow resistance of the power unit.

The shared substrate structure 1 also comprises an electrical interface to a common power circuit, e.g. to the DC intermediate circuit of a two-stage frequency converter, the poles of which in the embodiment of the figure are DC+ and DC−. In this embodiment the interface is implemented with two busbars 11, 12, which connect to each power module via the connections 9, 10 and which can be fixed to the substrate with supporting insulators 6. As is obvious to a person skilled in the art, the number of poles of a common power circuit depends on the type of the device, e.g. in the so-called 3-point inverter described in patent publication U.S. Pat. No. 6,219,265 it can comprise three poles.

In the arrangement, locations for multiple power units are configured in the substrate, in which locations are liquid interfaces and electrical interfaces compatible to the substrate structure. According to a preferred embodiment of the invention the interfaces in question are similar regardless of the type and substrate position of the power unit, in which case the power units can be disposed in any substrate position whatsoever, but they can also, within the scope of the same inventive concept, be different, e.g. according to the power unit type. The electrical connections of the power units, in the embodiment of the figure U, V, W, are situated on the outer surface of the unit without an interface to the substrate structure.

According to the invention each power unit comprises a capacitor, e.g. an INU-specific one $C_1$ as described in connection with FIG. 1, connected to the common power circuit, which capacitor makes it possible that a high-capacitance energy storage unit $C_{DC4}$ possibly comprised in the system can, according to FIG. 4A, be separate and can be situated outside the substrate structure and the power units connected to it.

FIG. 5 presents as a single-line drawing an embodiment of one possibility according to the invention to implement with a frequency converter an electric motor drive braking to the network. In the embodiment all the different types of power units, the rectifying bridges $AFE_5$, $REC_5$ and the inverter bridge $INU_5$ are disposed on a common substrate and they have a common DC intermediate circuit, in which is a separate energy storage $C_{DC5}$. It has been possible to connect the output connections U, V, W of the INU units directly together without prior-art components limiting current imbalances, which is based on the fact that the units disposed in the same substrate structure are so symmetrical in terms of their cooling and electrical interfaces and controls as is possible within the scope of mechanical and electrical manufacturing tolerances.

According to the invention the power units connected to a common substrate can be of different types (such as a rectifying unit REC implemented with diodes, a DC chopper DC/DC enabling electrical resistor braking, a DC/AC transformer forming single-phase output voltage, et cetera), of the same type connected in parallel supplying a common load or each supplying its own load or structurally similar but configured for different tasks (such as AFE and INU).

FIG. 6 presents a layout option for the power parts of an electric drive according to FIG. 5. All the power units in it are connected to a common substrate 1, on the other side of which an energy storage $C_{DC6}$ connected to a common DC intermediate circuit is disposed. The supply network is cabled from the input connectors $L_1$, $L_2$, $L_3$ of the frequency converter to the rectifying unit $REC_6$ and to the so-called network inverter unit $AFE_6$ connected in parallel with it via the filter units $L_6$, $LCL_6$. The output phases of both INU units $INU_6$ can e.g. be connected with busbars and can be cabled to the output connectors U, V, W of the frequency converter.

FIG. 7 presents an embodiment of a control arrangement according to the invention for controlling power units disposed on a common substrate 1. In the arrangement the control unit $CU_A$ of the frequency converter is connected with a first fast communications bus to a substrate-specific controller $STAR_7$, which is further connected with second fast communications buses to each power unit to be controlled. Particularly in small systems, the substrate-specific controller can be integrated into the control unit. The physical implementation of communications buses can advantageously be based on the use of optical fibers. The control pulses of controllable power semiconductor components (e.g. IGBTs) can be formed inside a power unit timed by a common control unit or they can be formed in a common control unit and transmitted via the controller $STAR_7$ to the power modules as simultaneously as the component technology allows (typically a timing difference of less than 10 ns). This makes it possible for the output connections of the parallel-connected power modules, such as the INU units $INU_7$ in the embodiment of the figure, to be connected without passive components limiting imbalances in the current.

The control arrangement according to the embodiment also enables according to the invention physically similar units to be programmably configured from a common control unit $CU_7$ for different tasks (e.g. AFE and INU). In connection with parallel connections it is also possible to control via a communications bus a failed power unit out of use, in which case the electric drive can continue its operation at reduced capacity through the action of the remaining serviceable units.

It is obvious to the person skilled in the art that the different embodiments of the invention are not limited solely to the examples described above, but that they may be varied within the scope of the claims presented below.

The invention claimed is:

1. A power electronics device that is a frequency converter, the power electronics device comprising:
   liquid-cooled power units including at least one power semiconductor component that is an insulated-gate bipolar transistor (IGBT) or a diode, wherein the power units are mechanically separate;
   a substrate, among at least one substrate, and on which the power units are disposed, wherein the substrate includes liquid cooling ducts and is common to more than one power unit;

an electrical interface connected to each power unit via a power circuit interface on a side surface of each power unit, and connected to the substrate via a supporting insulator on a top surface of the substrate, wherein each power unit is connected, via a liquid cooling interface on a bottom surface of each power unit, to a liquid cooling interface on the top surface of the substrate;

electrical connectors on a top surface of each power unit for connecting to outside each power unit; and one liquid cooling interface and one power circuit interface on a side surface of the substrate for connecting to outside the substrate.

2. The power electronics device according to claim 1, wherein:
all the liquid cooling interfaces of the liquid cooling ducts in the substrate to the power units are essentially the same shape, and
cross-sectional areas and shapes of the liquid cooling ducts are dimensioned in such a way that pressure differences between the incoming and outgoing liquid connection points of power units disposed on the same substrate are essentially equal.

3. The power electronics device according to claim 1, wherein the liquid cooling ducts arranged in the substrate and cooling liquid flows of the liquid cooling interfaces of each power unit to be connected to the liquid cooling ducts arranged in the substrate are configured in such a way that the cooling liquid flows of the power units intended for the same operation are equal.

4. The power electronics device according to claim 1, wherein the liquid cooling ducts are designed to be compatible in such a way that a waterproof interface forms between a power unit and the substrate at the same time as the unit is fixed to the substrate and to the power circuit, without separate fixing parts being connected to the liquid cooling interface on each power unit or the liquid cooling interface substrate.

5. The power electronics device according to claim 1, wherein the substrate comprises a bulbar arrangement, via which the power units disposed on the substrate are connected to a common power circuit, comprising one interface to outside the substrate and which arrangement comprises at least two rails.

6. The power electronics device according to claim 1, wherein the impedances to common power interface points of electrical connections inside the power units intended for the same operation are configured to be essentially equal in such a way that the electrical connections inside the power units intended for the same operation are arranged with switching parts that are similar or are mirror images with respect to each other.

7. The power electronics device according to claim 1, wherein the power units that comprise controllable semiconductor components comprise at least one capacitor connected to a common power circuit interface and fitted near the controllable power semiconductor components.

8. The power electronics device according to claim 1, wherein:
the poles of an energy storage unit belonging to a DC intermediate circuit of the frequency converter are connected to the power circuit interface of the substrate, and
the energy storage unit is disposed outside the substrate structure.

9. The power electronics device according to claim 1, wherein the power units that comprise a controllable semiconductor component and are disposed on the same substrate are connected with a fast communications bus to a common control unit from where the physically similar units are configured to be programmably configurable for different tasks.

10. The power electronics device according to claim 1, wherein some or all of the power units belonging to the same substrate are configured to be similar and configured to receive from the control unit the same type of control signals and are connected in parallel to supply the same load.

11. The power electronics device according to claim 1, wherein some of inverter units belonging to the same substrate are configured to supply a load and some to function as a connection unit towards a supply network.

12. The power electronics device according to claim 1, wherein when multiple power units are connected in parallel, and when one power unit fails, the failed unit in question can be controlled out of use, in which case the other units continue to operate.

13. The power electronics device according to claim 1, wherein when multiple power units are connected in parallel, for saving energy some of the multiple power units connected in parallel are configured to be stopped when a total power requirement does not require an operation of all the power units.

14. The power electronics device according to claim 1, wherein the control signals required by the controllable power semiconductor components of the power units are formed in a power unit timed by a common control unit or the control signals are formed in the common control unit, in which case they are configured to be transmitted to the power units via a fast communications bus.

15. The power electronics device according to claim 2, wherein the liquid cooling ducts arranged in the substrate and cooling liquid flows of the liquid cooling interfaces of each power unit to be connected to the liquid cooling ducts arranged in the substrate are configured in such a way that the cooling liquid flows of the power units intended for the same operation are equal.

16. The power electronics device according to claim 2, wherein the liquid cooling ducts are designed to be compatible in such a way that a waterproof interface forms between a power unit and the substrate at the same time as the unit is fixed to the substrate and to the power circuit, without separate fixing parts being connected to the liquid cooling interface on each power unit or the liquid cooling interface substrate.

17. The power electronics device according to claim 3, wherein the liquid cooling ducts are designed to be compatible in such a way that a waterproof interface forms between a power unit and the substrate at the same time as the unit is fixed to the substrate and to the power circuit, without separate fixing parts being connected to the liquid cooling interface on each power unit or the liquid cooling interface substrate.

18. The power electronics device according to claim 2, wherein the substrate comprises a busbar arrangement, via which the power units disposed on the substrate are connected to a common power circuit, comprising one interface to outside the substrate and which arrangement comprises at least two rails.

19. The power electronics device according to claim 3, wherein the substrate comprises a busbar arrangement, via which the power units disposed on the substrate are connected to a common power circuit, comprising one interface to outside the substrate and which arrangement comprises at least two rails.

20. The power electronics device according to claim 4, wherein the substrate comprises a busbar arrangement, via which the power units disposed on the substrate are connected to a common power circuit, comprising one interface to outside the substrate and which arrangement comprises at least two rails.

* * * * *